(12) United States Patent
Nishikawa

(10) Patent No.: US 6,277,201 B1
(45) Date of Patent: *Aug. 21, 2001

(54) CVD APPARATUS FOR FORMING THIN FILMS USING LIQUID REACTION MATERIAL

(75) Inventor: Tomohisa Nishikawa, Tama (JP)

(73) Assignee: ASM Japan K.K., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/301,091

(22) Filed: Apr. 28, 1999

(30) Foreign Application Priority Data

Apr. 30, 1998 (JP) .................................... 10-120760

(51) Int. Cl.$^7$ ............................ C23C 16/00; C23C 16/44; C23C 14/26
(52) U.S. Cl. .................... 118/726; 261/142; 118/723 VE
(58) Field of Search ............................. 118/726, 723 EB, 118/723 VE; 261/142; 392/386, 388

(56) References Cited

U.S. PATENT DOCUMENTS

| | | | |
|---|---|---|---|
| 5,097,800 | * 3/1992 | Shaw et al. ........................ | 118/730 |
| 5,362,328 | * 11/1994 | Gardiner et al. .................... | 118/726 |
| 5,476,547 | * 12/1995 | Mikoshiba et al. ................. | 118/726 |
| 5,690,743 | * 11/1997 | Murakami et al. ................. | 118/715 |
| 5,730,804 | * 3/1998 | Gomi et al. ........................ | 118/726 |
| 5,835,677 | * 11/1998 | Li et al. ............................. | 118/726 |
| 6,036,783 | * 3/2000 | Fukunaga et al. ................. | 118/724 |

FOREIGN PATENT DOCUMENTS 5-132779   5/1993   (JP) .

\* cited by examiner

Primary Examiner—Gregory Mills
Assistant Examiner—Sylvia R. MacArthur
(74) Attorney, Agent, or Firm—Knobbe, Martens, Olson & Bear, LLP

(57) ABSTRACT

A CVD apparatus includes: (a) a reaction chamber; (b) a vacuum device connected to the reaction chamber for vacuuming and exhausting the reaction chamber; (c) a susceptor that maintains the semiconductor substrate inside the reaction chamber; (d) a reaction gas supplier that supplies a reaction gas to the surface of the semiconductor substrate set on the susceptor; and (e) a liquid-source vaporization system connected to the reaction gas supplier, which is disposed upstream of the showerhead and is used for atomizing and vaporizing the liquid reaction material at a given flow rate prior to its entry into the reaction chamber. The liquid-source vaporization system includes: (i) an atomizer connected to a liquid reaction material supply source; and (ii) a vaporizer connected to the atomizer downstream thereof.

15 Claims, 3 Drawing Sheets

CVD APPARATUS FOR FORMING THIN FILMS USING LIQUID REACTION MATERIAL

BACKGROUND OF THE INVENTION

1. Field of the Invention

This invention relates to a CVD (Chemical Vapor Deposition) apparatus to form a thin film on a semiconductor substrate by a CVD method using liquid reaction materials having a low vapor pressure. Particularly, it relates to the CVD apparatus with a liquid-source vaporization system that supplies a flow-controlled liquid reaction material after its vaporization.

2. Description of the Related Art

Up to this time, the CVD method has been widely adopted as a thin film formation method for a semiconductor apparatus. The CVD method is a method to form a thin film on a substrate by importing several types of gases selected according to the type of film to be formed into the reaction chamber and causing a chemical reaction by applying thermal energy or plasma excitation energy. In recent years, liquid reaction materials with low vapor pressure have attracted more attention for the reasons that they are excellent in covering and filling gaps or steps.

For example, Japan Patent Laid-open No.5-132779 discloses an apparatus that vaporizes a liquid reaction material to supply it to the reaction chamber. In this case, the liquid reaction material, the flow rate of which is controlled by a liquid flow rate controller, is atomized by an ultrasonic vibrator (circular vibrator depth-direction resonance type ultrasonic vibrator) placed in the atomization means, and then heated and vaporized with a heater.

However, according to the apparatus disclosed by Japan Patent Laid-open No. 5-132779, after the completion of the thin film formation processing, a liquid reaction material remains behind inside the ultrasonic vibrator, the casing of the atomization means, etc. The liquid reaction material residual within the ultrasonic vibrator drips and accumulates in the casing, and is soon atomized. The liquid reaction material gases remaining in the casing are denatured or degenerated through further heat. This will create the source of particle generation and will contaminate semiconductor substrates in the subsequent thin film formation process.

In particular, because Ta $(OC_2H_5)_5$ which is one of the liquid reaction materials is decomposed at approximately 150° C. (302° F.), there is a high risk of creating a source of particle generation, if it remains in the casing.

Accordingly, an objective of the present invention is to provide a CVD apparatus equipped with a liquid-source vaporization system that does not leave any liquid reaction material within the system.

Another objective of the present invention is to provide a CVD apparatus with improved productivity by minimizing particle contamination.

In addition, another objective of the present invention is to provide a CVD apparatus equipped with a liquid-source vaporization system, which can perform cleaning work easily and quickly.

Furthermore, another objective of the present invention is to provide a CVD apparatus quipped with a liquid-source vaporization system, which can use various types of liquid reaction materials, regardless of their characteristics.

SUMMARY OF THE INVENTION

To achieve the above-mentioned objectives, the CVD apparatus of the present invention comprises the following elements:

In one embodiment, the CVD apparatus for forming a thin film on a surface of a semiconductor substrate under reduced pressure, comprises: (a) a reaction chamber; (b) a vacuum device connected to the reaction chamber for vacuuming and exhausting the reaction chamber; (c) a susceptor that maintains the semiconductor substrate inside the reaction chamber; (d) a reaction gas supplier (e.g., showerhead) that supplies a reaction gas to the surface of the semiconductor substrate set on the susceptor; and (e) a liquid-source vaporization system connected to the reaction gas supplier which is disposed upstream of the reaction gas supplier and is used for atomizing and vaporizing the liquid reaction material at a given flow rate prior to its entry into the reaction chamber, said liquid-source vaporization system comprising: (i) an atomizer connected to a liquid reaction material supply source, said atomizer atomizing the liquid reaction material from the supply source; and (ii) a vaporizer connected to the atomizer downstream thereof, said vaporizer vaporizing the atomized reaction material.

In another embodiment, the liquid-source vaporization system further comprises a cleaning device connected to the atomizer and the vaporizer, which evacuates the liquid reaction material remaining inside the atomizer and the vaporizer by generating a pressure difference between the outlet of the vaporizer and the inlet of the atomizer. In another embodiment, the liquid-source vaporization system further comprises a liquid flow controller for controlling the liquid flow rate of the liquid reaction material supplied to the atomizer. Further, in another embodiment, the atomizer atomizes the liquid reaction material by ultrasonic vibration, although atomization can be achieved by a high-pressure jet nozzle, for example. In anther embodiment, the vaporizer vaporizes the atomized reaction material by heating, although vaporization can be achieved by reducing the pressure, for example.

According to the CVD apparatus of the present invention, because the residual liquid material within the liquid-source vaporization system is completely eliminated, the particle contamination problem caused by the degeneration of the residual liquid material has been resolved. In addition, because the vaporizer is provided separately from the reaction chamber, contamination inside the reaction chamber, which is caused by particles generated by the vaporizer, can be minimized. Furthermore, because the CVD apparatus has a simple structure and it is easy to operate, it can shorten the time required for cleaning and enhance throughput. Furthermore, various types of liquid materials including liquid materials that can be vaporized at relatively low temperatures (e.g., 20° C. or lower) can be used. For example, the liquid material includes TEOS, $SiH(OC_2H_5)_3$, $SiH(CH_3)_3$, $Si(OCH_3)_4$, and $TEFS/FSi(OC_2H_5)_3$. Further, in the present invention, the reaction gas includes $O_2$, $O_3$, $O_2+O_3$, $NO_2$, $N_2O_4$, $N_2O$, and the formed thin film includes SiO and SiOF.

Here specifically, the cleaning device is connected to the atomization means and comprises (1) a cleaning-chemical supplier to supply cleaning chemicals into the vaporizer through the atomizer, and (2) an evacuater to evacuate the liquid reaction material left within the atomizer and the vaporizer.

More suitably, the cleaning-chemical supplier can include a mass flow controller and at least one valve, and the evacuater can include a trap device, an exhaust device, and at least one valve. Furthermore, the exhaust device can serve as a vacuum exhaust device that exhausts the reaction chamber. More suitably, the trap device can include a gas cooling device. More specifically, the atomizer is of a horn type. More suitably, the vaporizer can include a carrier gas supplier for supplying carrier gas.

The CVD apparatus according to the invention may further comprise a gas supplier connected to the showerhead to supply into the reaction chamber at least one gas selected from the group consisting of a reaction gas, a carrier gas, and a purge gas.

BRIEF DESCRIPTION OF THE DRAWINGS

These and other features of the invention will now be described with reference to the drawings of a preferred embodiment which is intended to illustrate and not to limit the invention, and in which.

DETAILED DESCRIPTION OF A PREFERRED EMBODIMENT

Figure 1:
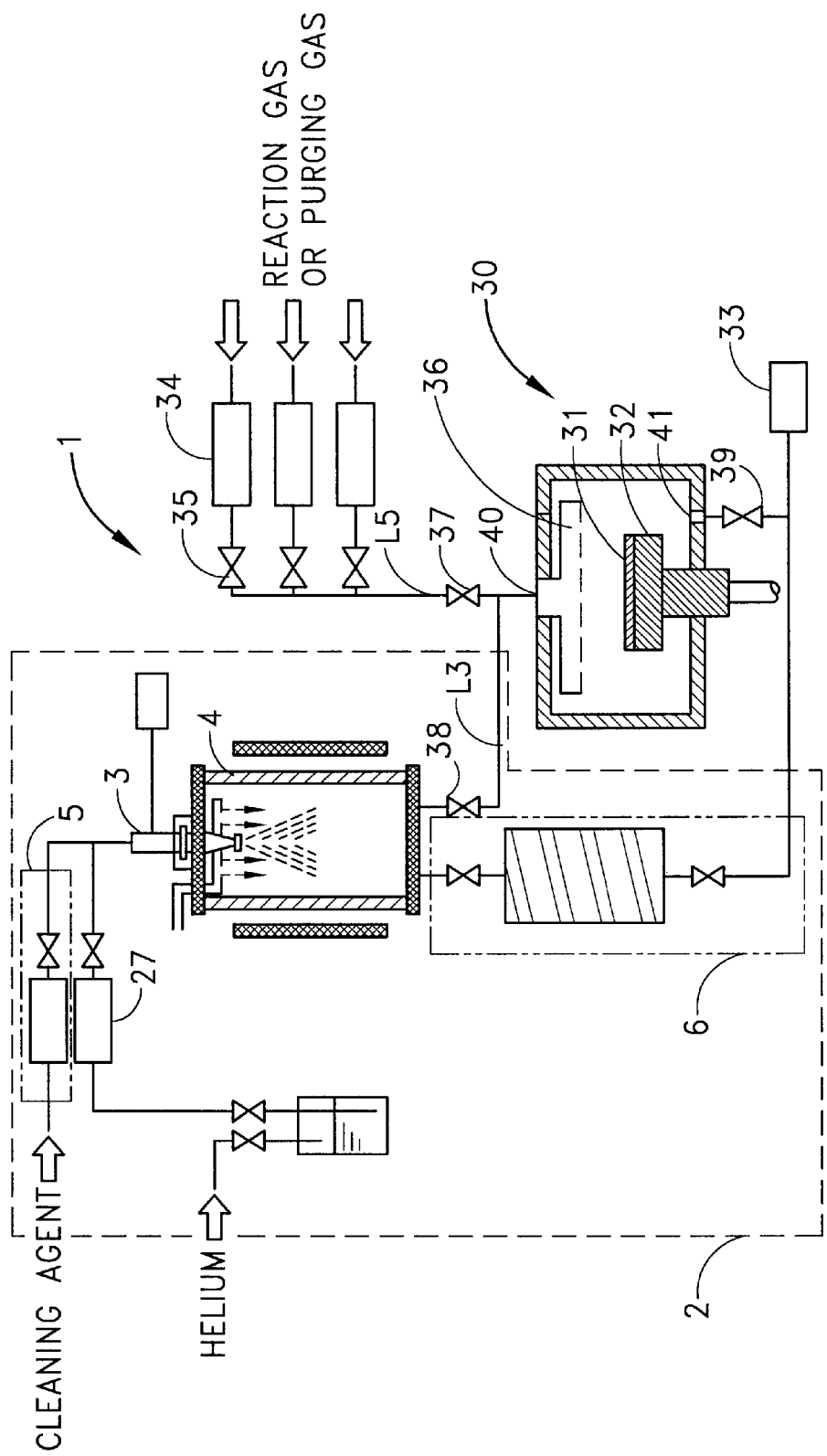
FIG. 1 schematically illustrates a suitable implementation example of the CVD apparatus according to the invention.

This invention is explained referring to the drawings in the following:

FIG. 1 schematically illustrates a suitable implementation example of the CVD apparatus according to the invention. The CVD apparatus (1) according to the invention comprises a reaction chamber (30), a vacuum exhaust device (33) that is connected to the reaction chamber (30) and which vacuums and exhausts the reaction chamber (30), a susceptor (32) that is provided within the reaction chamber (30) and maintains a semiconductor substrate (31), a showerhead (36) that is set up on the susceptor (32) and supplies a reaction gas to the surface of the semiconductor substrate (31), and a liquid-source vaporization system (2) that is connected to the showerhead (36) and vaporizes a liquid reaction material by controlling its flow rate to supply it into the reaction chamber (30). In the above, other types of reaction gas supplier can be substituted for the showerhead. The reaction gas supplier may include reaction gas nozzles arranged in such a way that a reaction gas is provided to the surface of a wafer in a direction parallel to the wafer, perpendicular to the wafer, or angled with respect to the wafer.

The reaction chamber (30) can be a conventional CVD apparatus made of quartz or Al alloy that is commonly used and has an intake port (40) to supply a reaction gas and an exhaust port (41) to exhaust gases from the inside. The vacuum exhaust device (33) can be a regular vacuum pump and can be connected to the exhaust port (41) through a valve (39). The susceptor (32) may be made of quartz or a metal with corrosion-resistant surface, e.g. an Al alloy and ceramics such as AlN, $Al_2O_3$, and MgO. In addition, multiple fine openings (not shown) can be provided on the surface for fastening purposes to maintain and stabilize the semiconductor wafer (31). The showerhead (36) may be a metal container of a nearly cylindrical shape with multiple fine openings on its lower surface facing the semiconductor substrate (31), which showerhead is connected to the intake port (40). The liquid-source vaporization system (2), as explained in detail below, comprises a liquid flow controller (27) to control the flow rate of the liquid reaction material, an atomizer (3) to atomize the liquid reaction material using ultrasonic oscillation, a vaporizer (4) to heat and vaporize the atomized liquid reaction material, and cleaning devices (5,6) to clean the atomizer (3) and the vaporizer (4).

The reaction chamber (30) is linked to the vaporizer (4) through a valve (38) via a line (L3). In addition, the reaction chamber (30) can be linked to a reaction gas supplier to supply a reaction gas other than the above-mentioned liquid reaction material through a valve (37) via a line (L5). The reaction gas supplier comprises a gas flow controller (34) and a valve (35), and a plurality thereof can be provided according to need if multiple reaction gases and purge gas are used. Furthermore, the reaction chamber (30) can include a susceptor (32) made of a resistance-heating type heater, by which the semiconductor wafer (31) can be heated and maintained at a desired temperature. As another heating device, an infrared lamp can be used by setting up it in the vicinity of the reaction chamber (30).

Figure 2:
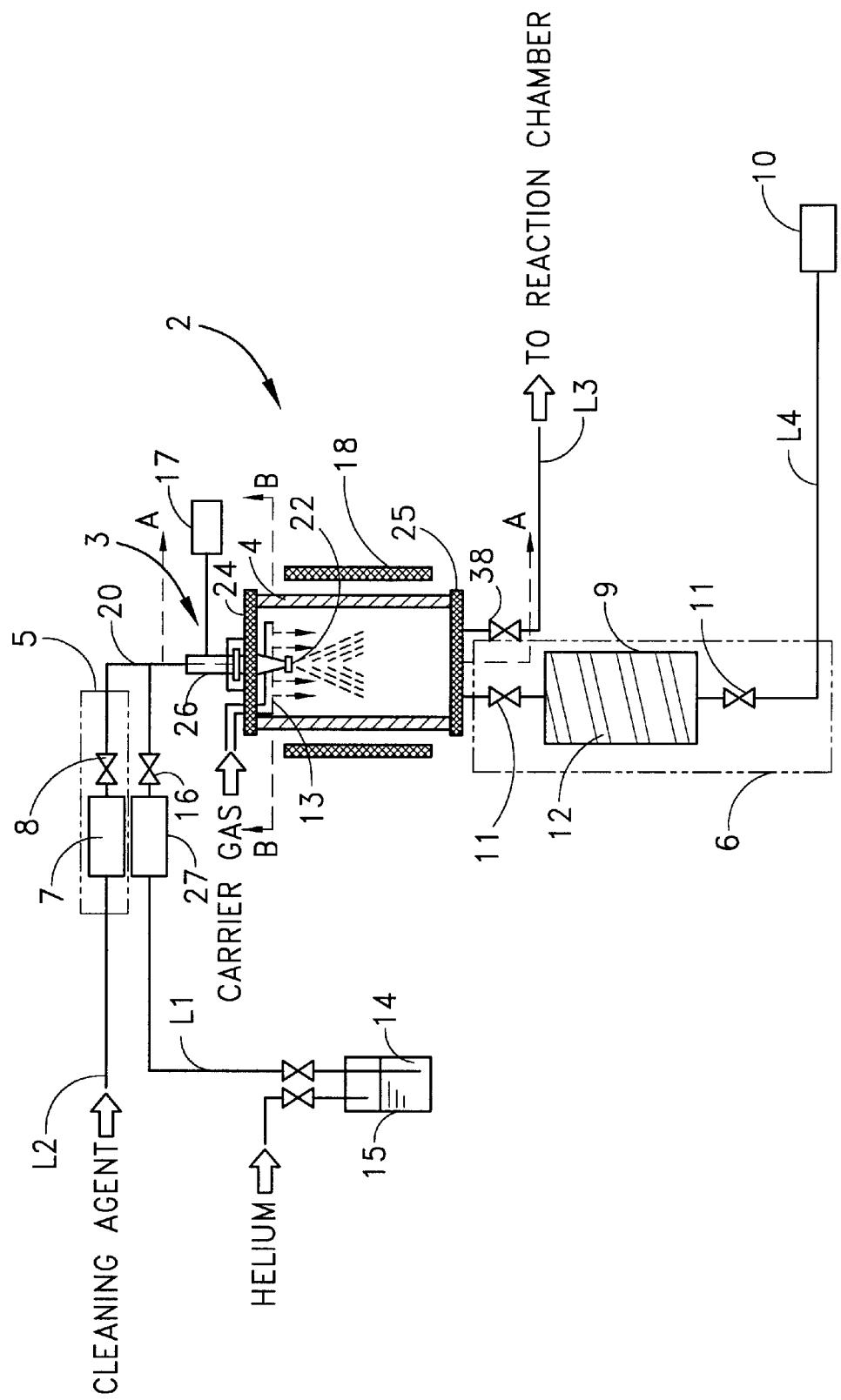
FIG. 2 schematically illustrates a suitable implementation example of a liquid-source vaporization system according to the invention, which is used for the CVD apparatus shown in FIG. 1.
Figure 3B:
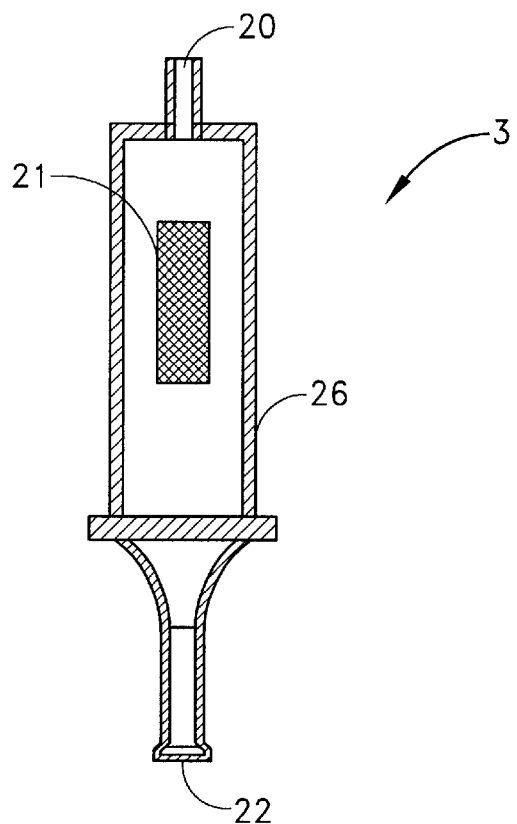
FIG. 3B schematically indicates an enlarged cross section of a carrier gas supplier.
Figure 3A:
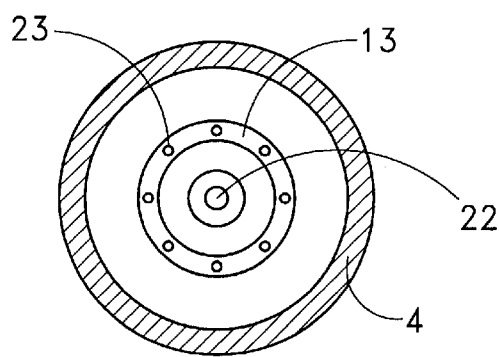
FIG. 3A schematically indicates an enlarged cross section of a vaporization device used for the liquid material vaporization device according to the invention.

FIG. 2 is a schematic illustration of the liquid-source vaporization system (2) used for the CVD apparatus shown in FIG. 1. FIGS. 3A and 3B respectively are an enlarged schematic cross sections from the 3A—3A line and from the 3B—3B line in FIG. 2. The liquid-source vaporization system according to the invention comprises the liquid flow controller (27) to control the flow rate of a liquid reaction material (14), the atomizer (3) to atomize the flow rate-controlled liquid reaction material (14) by heating, and the cleaning device (5,6) which is connected to the atomizer (3) and to the vaporizer (4).

The liquid flow controller (27) is suitably a thermal-type mass flow controller. One of its ends is linked with an ampoule (15) containing the liquid reaction material via a line (L1) and the other end is linked with an inlet (20) of the atomizer (3) through a valve (16).

The atomizer (3) is suitably of a horn type and has a body (26) of a nearly cylindrical shape and a jet outlet (22) of a tapered shape. The atomizer (3) is electrically connected to an external oscillator (17) to enhance the internal ultrasonic vibrator (21) (See FIG. 3A). Ultrasonic vibration energy generated by the ultrasonic vibrator (21) is conveyed to the jet outlet (22). Receiving the vibration energy at the jet outlet (22), the liquid reaction material is atomized (changed to minute particles). The atomizer (3) is connected to one end of the vaporizer (4) through a lid member (24) so that an area around the jet outlet (22) is projected toward the inside of the casing of the vaporizer.

The vaporizer comprises a cylindrically-shaped casing with two open ends and is heated at a designated temperature by a heater (18) set up at the exterior of the side wall. Both open ends of the vaporizer (4) are closed by lid members (24) and (25). The lid member (25) suitably has two exhaust ports (19, 19'). One of the ports is connected to a line (L4) to evacuate and eliminate the residual liquid material explained below, and the other is connected to a line (L3) to supply the liquid material gas to the reaction chamber (30). The vaporizer (4) is maintained at a low pressure of less than 10 Torr during the thin film formation process by vacuuming and exhausting via the line (L3). When minute liquid material particles are supplied into the low-pressure casing, the partial pressure of the material against the entire pressure of the container becomes higher and the liquid material is vaporized at a relatively low temperature (e.g. lower than 150° C. A carrier gas supplier (13) is provided inside the vaporizer (4), and the liquid material vaporized by the atomizer (3) is mixed with a carrier gas. The carrier gas supplier (13) comprises a ring-shaped member (See FIG. 3B) for which multiple openings (23) are arranged on the circumference at constant intervals. Of note here is that the vaporizer (4) is completely separated from the reaction chamber in the invention.

The cleaning devices (5,6) comprise specifically a cleaning-chemical supplier (5) to supply a gas or liquid used for cleaning into the atomizer and the vaporizer, and an evacuater (6) to evacuate and eliminate any residual liquid reaction material and cleaning gas remaining in the atomizer (3) and the vaporizer (4).

The cleaning-chemical supplier (5) may include a mass flow controller to control the flow rate of cleaning chemicals and at least one valve (8) and is connected to an inlet (20) of the atomizer (3) via a line (L2). As cleaning chemicals, gases such as nitrogen, hydrogen, helium or argon, which are in the form of gas in the atmosphere at ambient temperature, and alcohol such as ethanol and methanol or low boiling point organic chemical compounds such as toluene, benzene, etc. can be used.

The evacuater (6) may include a trap device (9), an exhaust device (10), and at least one valve (11), and is linked to the vaporizer with a lid member (25) via a line (L4). The trap device (9) comprises a container of a nearly cylindrical shape, and a water path (12) is provided on the outside surface to circulate a coolant. To cool the trap device (9), the water cooling method using cooling water of less than 15° C. (59° F.) is adopted, but it can be further air-cooled by a fan, etc. Inside the trap device (9), an absorbent such as synthesized zeolite (not shown) is provided to absorb the re-liquefied liquid material. By changing the layout, it is possible to set up several of the trap devices in series. The exhaust device (10) can be a regular vacuum pump, and the vacuum pump (33) that is used for exhausting the reaction chamber can be used for this purpose as well.

The operation method of the CVD apparatus (1) according to the present invention will be explained below.

The liquid reaction material (14) in the ampoule (15) is continuously pressurized by helium (He) gas and is transported to the liquid flow controller (27) via the line (L1). In the liquid flow controller (27), the liquid reaction material (14) the flow rate of which is accurately controlled is transported to the inlet (20) of the atomizer (3) through the valve (16).

The liquid reaction material (14) that enters from the inlet (20) is transported to the inside of the atomizer (3), and receiving vibration energy emitted by the ultrasonic vibrator (21), it is changed to minute particles at the jet outlet (22). Minute particles of the liquid reaction material (14) are supplied to the inside of the vacuum-exhaustion vaporizer (4) by the exhaust device (10 or 33), and are vaporized by being heated by the heater (18). At this time, suitably, a carrier gas such as He or Ar gas is supplied from the carrier gas supplier (13) that is provided in the vicinity of the upper end area of the vaporizer.

The vaporized liquid reaction material (14) is supplied into the vacuum-exhausted reaction chamber (30) via the line (L3) through the valve (38). Another reaction gas is also supplied into the reaction chamber (30) via the line (L5) through the gas mass flow controller (34) and valves (35, 37). The semiconductor wafer (31) set up on the susceptor (32) is heated by an external heating device (not shown) at a desired temperature, and is exposed to the atmosphere of the reaction gas and vaporized liquid reaction material. Receiving thermal energy or high-frequency plasma energy, the molecules of the reaction gas are excited and causes a chemical reaction, and their vapor deposites on the surface of the semiconductor substrate. In this way, the desired thin film is formed.

After the thin film formation process has been completed and the inside of the reaction chamber (30) has been purged by a purge gas, the semiconductor wafer (31) is taken out from the reaction chamber (30) to move it to the next process.

The cleaning process of the liquid-source vaporization system (2) according to the present invention is performed by the cleaning-chemical supplier (5) and the evacuater (6). First, the valve (16) and the valve (38) are closed. The flow rate of cleaning chemicals is then controlled by the mass controller (7) and they are transported to the inlet (20) of the atomizer (3) via the line (L2) and through the valve (8). The cleaning chemicals and the liquid reaction material remaining in the atomizer (3) are changed to minute particles and discharged from the jet outlet (22) to the inside of the vaporizer (4).

The residual liquid material discharged to the inside of the vaporizer (4) is vaporized by the heater (18) and is transported to the trap device through the valve (11) together with liquid reaction material gas left inside the vaporizer (4). Inside the trap device (9), the residual liquid reaction material gas is cooled and liquefied by the cooling device (12) and is absorbed by an absorbent (not shown). At the trap device (9), most of the residual liquid reaction material gas is liquefied and absorbed. Gases other than those liquefied and absorbed are exhausted via the line (L4).

Although this invention has been described in terms of a certain embodiment, other embodiments apparent to those of ordinary skill in the art also are within the scope of this invention. Accordingly, the scope of the invention is intended to be defined only by the claims that follow.

The foregoing description is that of preferred embodiments of the invention, and various changes and modifications may be made without departing from the spirit and scope of the invention, as defined by the appended claims.

What is claimed is:

1. A CVD apparatus for forming a thin film on a surface of a semiconductor substrate under reduced pressure, comprising:
    (a) a reaction chamber;
    (b) a vacuum device connected to the reaction chamber for vacuuming and exhausting the reaction chamber;
    (c) a susceptor that maintains the semiconductor substrate inside the reaction chamber;
    (d) a showerhead that supplies a reaction gas to the surface of the semiconductor substrate set on the susceptor; and
    (e) a liquid-source vaporization system connected to the showerhead, which is disposed upstream of the showerhead and is used for atomizing and vaporizing the liquid reaction material at a given flow rate prior to its entry into the reaction chamber, said liquid-source vaporization system comprising:
        (i) a horn-type atomizer connected to a liquid reaction material supply source, said atomizer atomizing the liquid reaction material from the supply source by ultrasonic vibration, said atomizer having a tip from which the atomized reaction material is discharged;
        (ii) a carrier gas supplier disposed to surround the horn-type atomizer upstream of the tip of the atomizer to spout a carrier gas which is mixed with the atomized reaction material; and (iii) a hollow casing constituting a vaporizer connected to the atomizer to vaporize the atomized reaction material in the hollow casing, said hollow casing being equipped with a heater, wherein the tip of the horn-type atomizer and the carrier gas supplier are arranged inside the hollow casing.

2. The CVD apparatus according to claim 1, wherein the liquid-source vaporization system further comprises a cleaning device connected to the atomizer and the vaporizer, which evacuates the liquid reaction material remaining inside the atomizer and the vaporizer by generating a pressure difference between the outlet of the vaporizer and the inlet of the atomizer.

3. The CVD apparatus according to claim 2, wherein said cleaning device is connected to the atomizer and comprises:
   a cleaning-chemical supplier for supplying cleaning chemicals into the vaporizer through the atomizer, and
   an evacuater for evacuating and diverging from the reaction gas supplier the liquid reaction material left within the atomizer and the vaporizer.

4. The CVD apparatus according to claim 3, wherein said cleaning-chemical supplier comprises a mass flow controller and at least one valve.

5. The CVD apparatus according to claim 3, wherein said evacuater comprises a trapping device for trapping the liquid reaction material passing therethrough, an exhaust device for discharging gas within the trapping device, and at least one valve upstream of the exhaust device and downstream of the vaporizer.

6. The CVD apparatus according to claim 5, wherein said trapping device comprises a gas cooling device for trapping the liquid reaction material by cooling the same.

7. The CVD apparatus according to claim 3, wherein the vacuum exhaust device for exhausting the reaction chamber serves as the evacuater.

8. The CVD apparatus according to claim 1, wherein the liquid-source vaporization system further comprises a liquid flow controller for controlling the liquid flow rate of the liquid reaction material supplied to the atomizer.

9. The CVD apparatus according to claim 1, wherein the vaporizer vaporizes the atomized reaction material by heating.

10. The CVD apparatus according to claim 1, wherein said vaporizer comprises a carrier gas supplier for supplying carrier gas to the reaction chamber.

11. The CVD apparatus according to claim 1, further comprises a gas supplier connected to the reaction gas supplier to supply at least one selected from the group consisting of a reaction gas, a carrier gas, and a purge gas into the reaction chamber.

12. The CVD apparatus according to claim 1, wherein the reaction gas supplier is a showerhead provided above the susceptor.

13. The CVD apparatus according to claim 1, wherein the horn-type atomizer has an inlet disposed at an end opposite to the tip, and an ultrasonic vibrator is positioned between the inlet and the tip, wherein the reaction material passes from the inlet to the tip through the ultrasonic vibrator.

14. The CVD apparatus according to claim 13, wherein the vaporizer comprises a casing equipped with a heater, wherein the tip of the horn-type atomizer and the carrier gas supplier are arranged inside the casing.

15. The CVD apparatus according to claim 1, wherein the carrier gas supplier has a ring shape surrounding the horn-type atomizer.

* * * * *